(12) United States Patent
Holmberg et al.

(10) Patent No.: US 6,244,172 B1
(45) Date of Patent: Jun. 12, 2001

(54) TAMP PAD

(75) Inventors: Per Holmberg, Dalby; Lars Eriksson, Emmaboda, both of (SE)

(73) Assignee: Telefonaktiebolaget LM Ericsson (publ) (SE)

( * ) Notice: Subject to any disclaimer, the term of this patent is extended or adjusted under 35 U.S.C. 154(b) by 0 days.

(21) Appl. No.: 09/467,535

(22) Filed: Dec. 20, 1999

(30) Foreign Application Priority Data

Dec. 21, 1998 (SE) ..................................... 9804539

(51) Int. Cl.$^7$ ..................................... B41F 17/34
(52) U.S. Cl. .............. 101/41; 101/35; 101/163
(58) Field of Search .................. 101/379, 376, 101/41, 36, 35, 163, 170; 118/264, 266

(56) References Cited

U.S. PATENT DOCUMENTS 5,383,398  1/1995  Binnen ................................ 101/41

FOREIGN PATENT DOCUMENTS

| 195 18 588 | 11/1996 | (DE) . |
| WO 92/05960 | 4/1992 | (WO) . |
| WO 97/34459 * | 9/1997 | (WO) . |
| WO 99/15334 | 4/1999 | (WO) . |

OTHER PUBLICATIONS

Liljegren, Fredrik, International–Type Search Report, Search Request No. SE98/01515, Sep. 3, 1999, pp. 1–4.

* cited by examiner

Primary Examiner—John S. Hilten
Assistant Examiner—Kevin D. Williams
(74) Attorney, Agent, or Firm—Jenkens & Gilchrist

(57) ABSTRACT

Tamp printing of at least one picture (4) occurs by means of at least one tamp pad (1, 18, 24, 34) on a piece (3), which has boundary surfaces (5, 13) forming angles relative to each other, the tamp pad first printing in one direction (10) against a boundary surface (13, 43) and thereafter, after further compression of the tamp pad (1) against said boundary surface (13) due to its deformation, prints in another direction (45) than the direction (10) against another boundary surface or other boundary surfaces (5, 43), whereby the picture is transferred to said boundary surfaces.

20 Claims, 3 Drawing Sheets

TAMP PAD

FIELD OF THE INVENTION

The present invention relates to a device and a method at a tamp pad and at tamp printing intended to simplify the printing method, in which ink is applied on a tamp pad, that prints a picture on a piece having concave sides and a convex bottom, wherein the tamp pad has a shape in conformity with the piece for printing on the bottom and sides of the piece and can be provided with channel means for conveying away air accumulated between the piece and the tamp pad, so that the ink can be applied on surfaces difficult to access.

BACKGROUND OF THE INVENTION

In designs of this kind appearing on the market it is possible by means of a method called tamp printing to transfer a picture to a piece on surfaces which are only slightly curved, for example a ball, a front side on a mobile telephone etc. The principle for tamp printing of metal ink is described for example in PCT/SE97/00372 and PCT/SE98/01678, which are hereby incorporated by reference. The printing with good result on surfaces with corners and neighbouring sides and/or other formations, such as holes, recesses or elevations, is difficult with present technique to tamp print, as the tamp pad will not print satisfactory in corners and as it is not designed to print on neighbouring sides and further as it is not capable of allowing accumulated air in the corners to escape, as the tamp pad covers the air accumulation from all directions, so that the ink will not be applied on the piece at these locations. This means that great areas will not be covered by ink. This is a great problem, as this method has to be limited to use on pieces not having a complicated shape as mentioned above.

At the manufacture of electronic units, for example mobile telephones, an electrically conductive layer is needed for shielding off electromagnetic radiation which layer is provided by inks containing a great proportion of metal fragments which conduct current. By means of tamp printing it is possible to print such a layer solely on simple surfaces, which only has a moderately curved surface, and sides, corners, holes, smaller elevations etc can not be printed. By means of other known methods, which are more expensive to use, such as vacuum vaporizing and spray painting, it is possible to provide these units with an electrically conductive layer also on places difficult to access. Otherwise leakage of electromagnetic radiation appears at holes in the layer.

Thus, tamp printing is a comparably very cheap method, as costs for removing undesired ink at undesired places, for example at holes, screw connections and front sides, can be dispensed with. There is further no spillage of ink, as only the needed picture is printed. The machines used for this method are cheaper. It is also simple to automate the method, which means that the labour cost also is low. For this reason it is very interesting to solve the problems with said methods, so that tamp printing in corners and their neighbouring sides as well as on curved surfaces and irregularities becomes possible.

SUMMARY OF THE INVENTION

An object of the present invention is thus to eliminate the drawbacks inherent with the designs mentioned above by adopting the shape of the tamp pad in accordance with the design of the piece with concave and convex surfaces, so that at least a neighbouring side of the piece can be concurrently printed by providing the tamp pad with recesses ventilating away the air accumulations at the corners and other hole spaces of the piece, so that the tamp pad is no longer prevented from printing in the mentioned spaces, which are difficult to access.

According to the invention an adaption of the appearance and shape of the tamp pad after the piece to be printed has now been accomplished in that the pad is provided with concave and convex surfaces; further the problem has been solved with the air accumulations formed at the printing and preventing application of ink on the surfaces difficult to access for the tamp pad by transferring the air away from these places via channels and/or hole means in the tamp pad.

According to the invention the tamp pad has at least one corner, generally formed by two sides forming an angle with each other, said sides printing in two stages two neighbouring sides of the piece, so that the substantially horizontal surface of the piece is first printed, when the tamp pad moves generally downwards. Stage two means that the soft tamp pad at continued downwards movement is flattened against the bottom of the piece, so that a counter-pressure is formed, which in turn causes a deformation of the tamp pad, which then expands sidewise, contacting at least an angled side of the piece, so that the tamp pad then is able to print this side. Via a channel, which runs from a corner of the tamp pad upwards all the way to the upper part of the tamp pad, an air accumulation formed at this corner and created at depressing the tamp pad against the piece is conducted away. This means that the ink is not prevented by the air accumulation to reach the corner and other places which otherwise would be difficult to access. In a preferred embodiment of the invention the ink is first fetched from a printing block, which is covered with the intended picture. For accomplishing that the picture is also attached to the sides of the tamp pad, the printing block has a shape adapted to the shape of the tamp pad when the ink is fetched. The tamp pad can also move pivotally over the printing block, wherein the side is first applied against the printing block, so that it is provided with ink. Thereafter the pivotal movement of the tamp pad is continued with continued contact with the printing block, so that the contact angle with this is continuously changed, the remainder of the picture thereby being attached to the tamp pad. The ink can also be fetched from a rotating printing block, that emits the ink to a rotating tamp pad. Combinations of a curved printing block and a movement of the tamp pad can of course also be possible for transferring the entire picture to the tamp pad. At the tamp printing of a piece which is formed as the inside of a mobile telephone cover the tamp pad according to the invention in its preferred embodiment is formed generally as a block provided with a convexly curved underside. Connecting thereto in the hereby formed corners are four generally vertically connecting, concavely curved sides. The upper side of the block does not contact the piece at printing, which means that it can have any shape. When the ink, which constitutes a picture, now shall be printed on the piece, this is accomplished in three stages. First the picture is transferred to the horizontal part of the piece, for example a cover of a mobile telephone, when the bottom of the block is applied on this place. A continued compression of the tamp pad in stage two deforms the convex bottom surface, this deformation being transferred through the tamp pad, so that the convex sides come in contact with the generally vertical sides of the piece, which means that also these are tamp printed. The marked corners of the tamp pad will according to the invention be pressed into the corners of the piece in stage three. In the irregularities of a piece it may be difficult to access with a tamp pad with printing ink. This is according to the invention solved by shaping the tamp pad as exactly as possible after the piece to be printed. For this reason the tamp pad is provided with projections corresponding to recesses in the piece and recesses in the tamp pad corresponding to projections of the piece. Hole means and projections of the tamp pad can also need to be aired via aeration channels in order to remove the air accumulations which prevent the ink from adhering to the piece in accordance with the description above. It is also possible according to the invention to form the tamp pad as a rotating wheel, which fetches its picture via a rotating wheel shaped printing block, which is continuously provided with ink, so that the rotating tamp pad can emit its picture to a piece moving at the same speed as the rotating tamp pad.

As in the above described method to tamp print in three stages, also the rotating tamp pad can do the same; the tamp pad is provided with a convex bottom and concave sides and is compressed, so that the sides can print on the sides of the piece. Likewise, the rotating tamp pad can be provided with projections and recesses for enabling printing on least accessible places on the piece. It can also be provided with aeration channels for ventilating away air accumulations described above. By the method of a form adapted tamp pad provided with recesses it will become possible to tamp print on parts of and/or entire pieces equipped with complicated details, such as corners, hole means and projections. In comparison with other methods, the most important advantages with the invention is that the method is much cheaper and faster and gives a result which is improved in form of entirely covered surfaces even on complicated parts of the piece with a reduced number of tamp printings. With this method the piece does not need to be tamp printed several times from several directions for covering all surfaces of the piece.

BRIEF DESCRIPTION OF THE DRAWINGS

The invention will be further described by means of some preferred embodiments under reference to the enclosed drawings, in which.

DETAILED DESCRIPTION OF EMBODIMENTS OF THE INVENTION

Figure 1:
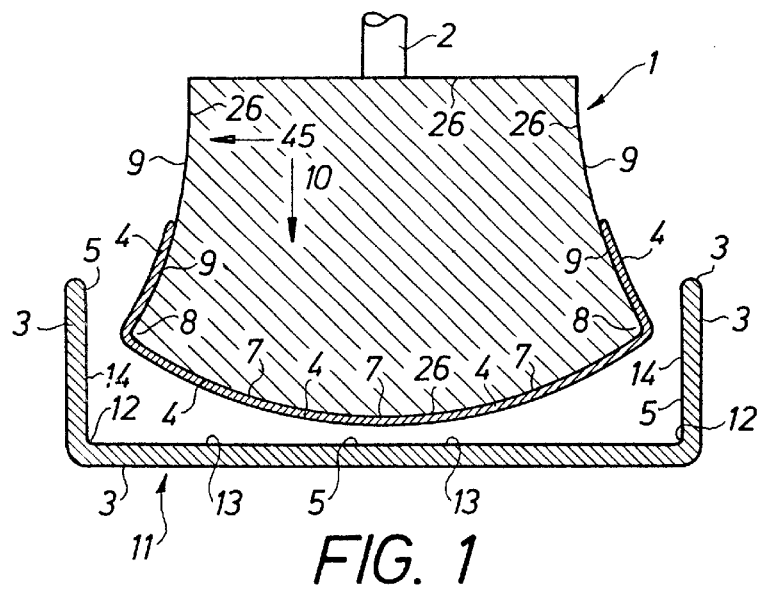
FIG. 1 is a section through a tamp pad according to the present invention in the first stage of a printing method, before it prints on the bottom of a piece.

A first stage in a tamp printing method is shown in FIG. 1, the device according to the invention having a first embodiment of a tamp pad 1, which is formed of a soft material, preferably silicon, and which is moving generally in a direction 10. The pad is attached to an attachment device 2 of a tamp printing machine, a picture 4, which preferably consists of one colour containing metal fragments for being electrically conductive, being fetched from a printing block, whereafter it shall be printed on a piece 3, for example on an inside 5 of a mobile telephone cover 11. The tamp pad 1 has a number of external boundary surfaces 26, at least one such surface being a side 7, which has a convex form, and neighbouring boundary surfaces, which form corners 8, and at least two concave sides 9. The piece 3 has at its inside 5 corners 12, a bottom 13 and at least two sides 14.

Figure 2:
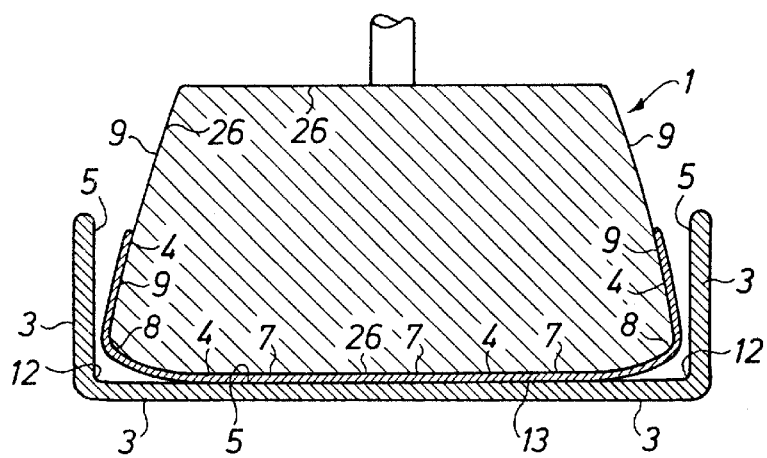
FIG. 2 is a section of the same tamp pad according to the present invention in the second stage of a printing method, when it prints on the bottom of a piece.

A second stage of the tamp printing method is shown in FIG. 2. When the side 7 of the tamp pad 1 has approached the bottom 13 of the piece 3 and hereby started to cover the majority hereof, a portion of the picture 4 commences to adhere to the inside 5 of the piece 3. At the commencement of the deformation the side 7 of the tamp pad 1 is flattened out, so that its previously concave sides 9 are straightened out in an introductory phase of stage two, until they are getting slightly convex at the end of stage two. Hereby the corners 8 of the tamp pad approach the corners 12 of the piece.

Figure 3:
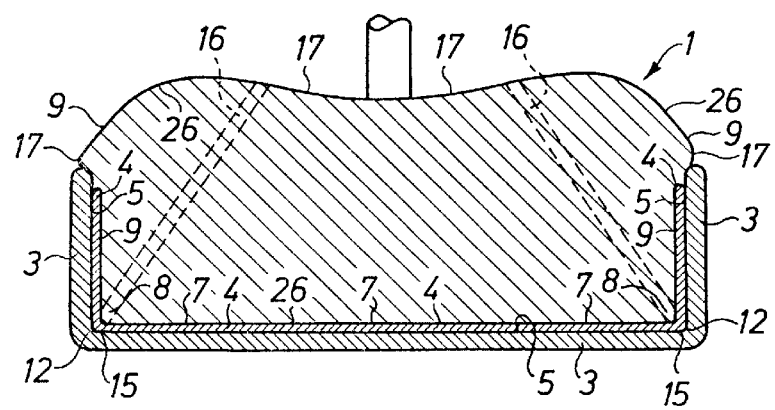
FIG. 3 is a section of the same tamp pad according to the present invention in the third stage of a printing method, when it prints on the sides of a piece.

A third stage of the tamp printing method is shown in FIG. 3. In this position the tamp pad 1 has reached its maximum bottom position, wherein it has covered the entire inside 5 of the piece 3 with its entire side 7 and associated corners 8 and sides 9, the entire picture 4 now having been attached to the inside 5 of the piece 3. It is of course possible for the tamp pad 1 to move in a direction 45. Then the side 9 is made convex and the side 7 concave, so that the side 14 is first tamp printed, the deformation of the tamp pad deforming the concave side 7, so that it becomes convex and tamp prints the bottom 13 of the piece 3. In order that an air accumulation 15 at the corner 8, 12 shall not prevent the picture 4 from attaching here, it is emptied via aeration channels 16, which may be designed as through channels in the tamp pad 1 and/or as recesses in the form of for example grooves somewhere in the surface of the tamp pad 1, such grooves extending from the air accumulation 15 to upper parts 17 of the tamp pad 1 free from the piece 3, so that the air is not prevented by the piece 3 from escaping.

Figure 4:
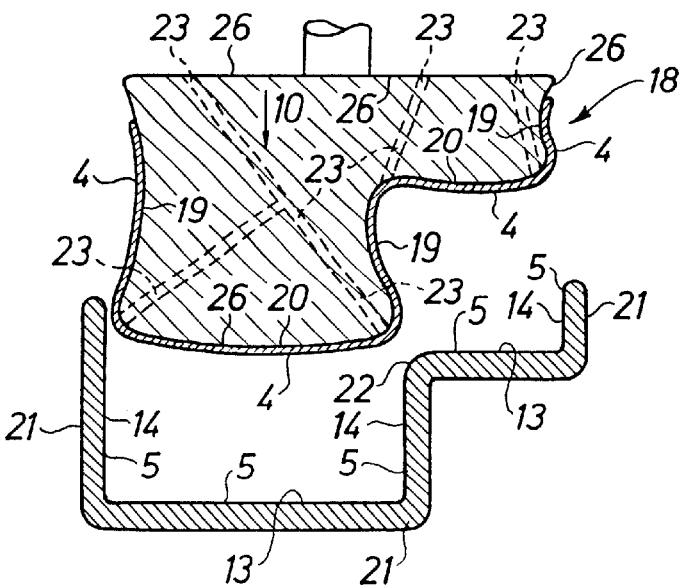
FIG. 4 is a section through an alternative embodiment of a tamp pad according to the present invention, before it prints on a piece.

A second embodiment of a tamp pad 18 is shown in FIG. 4. This pad 18 is provided with at least a number of concave sides 19 and a number of convex sides 20 and is shown in stage one according to FIG. 1. According to the invention it is possible to tamp print on a substrate with more than one bottom 13 and more than two sides 14 in the same process generally in one direction 10. Then also convex corners can be tamp printed. Also in this embodiment all corners may need to be aired through aeration channels 23, as has been described above. The picture 4 is transferred in accordance with the three stages as has been described above to the inside of the piece 21.

Figure 5:
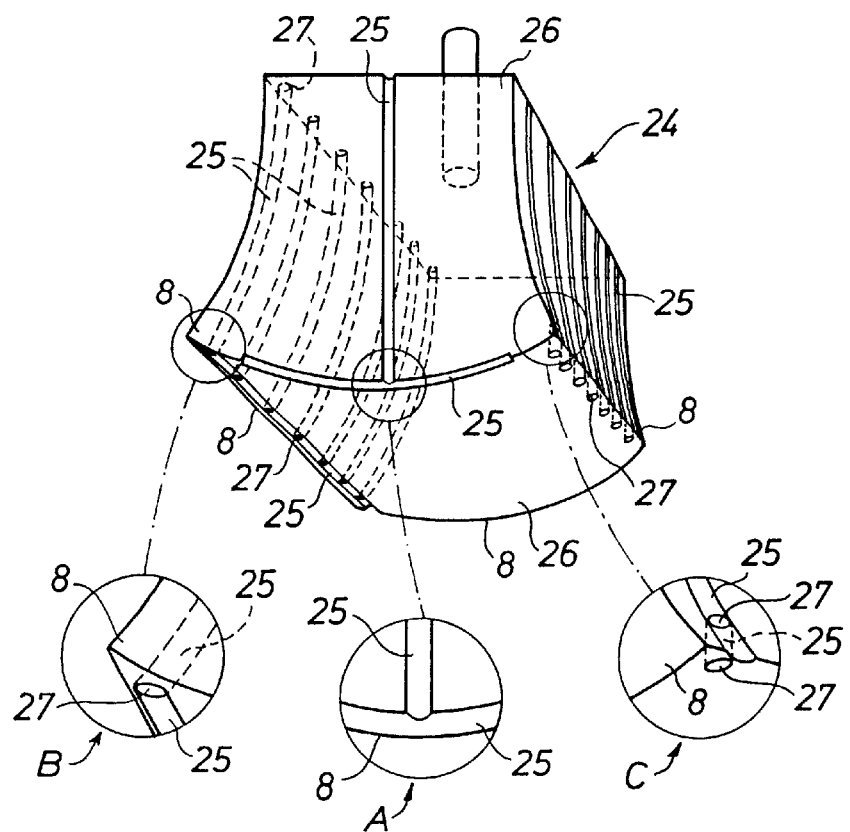
FIG. 5 is a schematic perspective view of a tamp pad according to the invention, provided with aeration channels.

A tamp pad 24 is shown in perspective in FIG. 5. This pad 24 show examples of different types of aeration channels 25, which have the purpose of ventilating away the air accumulations 15 mentioned in relation to FIG. 3 above. These channels can be designed as aeration channels 25 arranged in the outer boundary surface 26 of the tamp pad 24 in accordance with enlargement A. They may also be designed as aeration holes 27, which run from the outer boundary surface 26 at the corner 8 and then open on the upper side of the tamp pad 24 in accordance with enlargement B. The aeration channels 25 may also wholly or partly run inside the tamp pad 24, as is shown in enlargements B and C.

Figure 6:
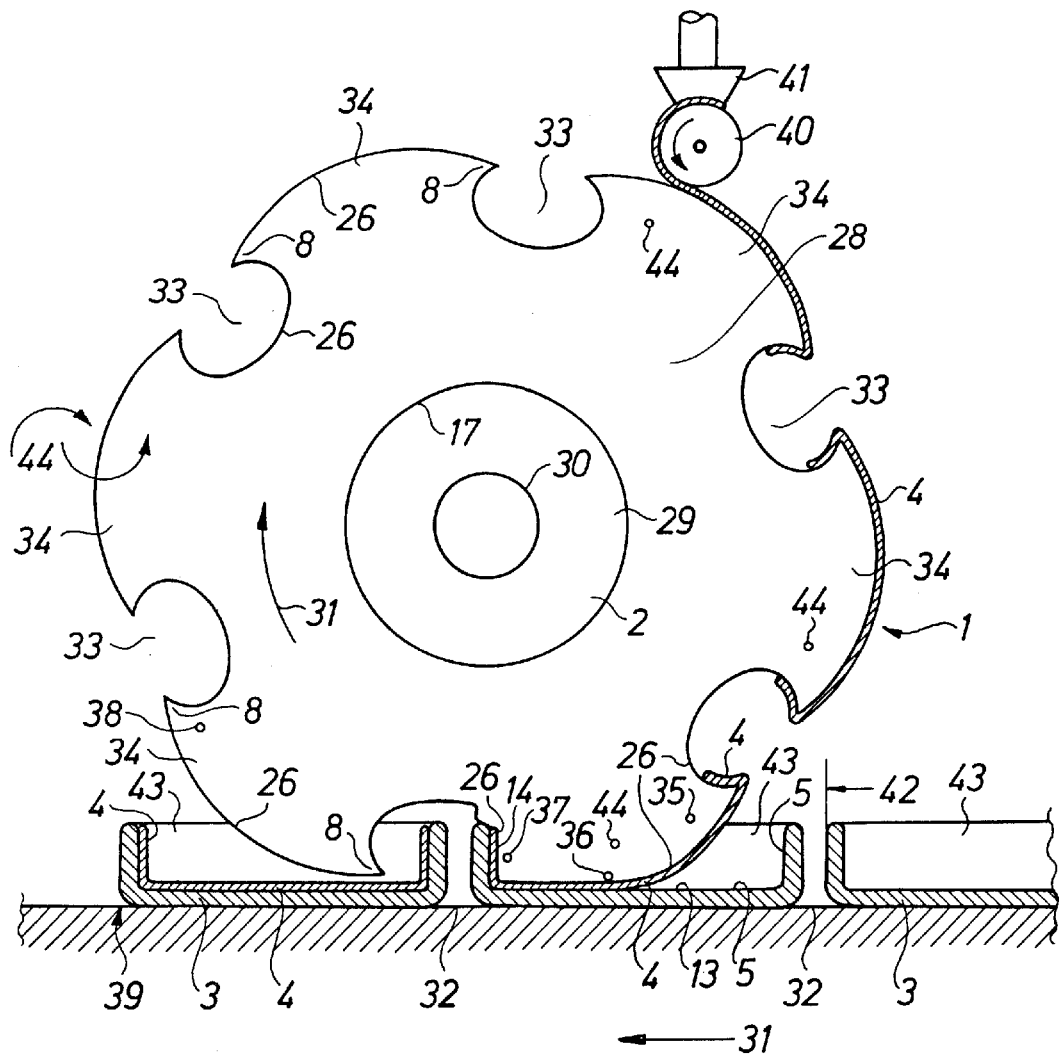
FIG. 6 is a view of a rotating tamp pad, which is provided with tamp pad portions, and a section through an associated conveyor belt with pieces.

FIGS. 1–3 illustrate the three separate stages in a printing method. These stages are also performed in a tamp printing method described below, wherein a rotating tamp pad 1 according to FIG. 6 is like a tyre 28 in a side view, and its attachment device 2 is like a hub 29 in a wheel rotating in direction 31 around a shaft 30. The upper side 17 of the tamp pad 1 is then closest to the shaft 30. In this tamp printing method the piece 3, which is shown in section, is transferred on a conveyor belt 32 with the same speed and direction as the rotation of the tamp pad 1. The pad 1 is provided with notches 33, which means that the tamp pad 1 is divided into several tamp pad portions 34, which individually may tamp print the inside 5 of a piece 3 with a picture 4. Printing ink is also applied in a continuous process from an ink container 41 on the tamp pad portions 34 of a rotating printing block 40, which can be made so small that it can be housed in the notches 33, and thus it becomes possible to transfer the picture on its boundary surfaces 26. A further rotating printing block can of course be arranged at at least one of the sides 44 of the rotating tamp pad portion 34, so that it further can tamp print on the inside 43 of the piece 3. Under its continuous rotation the tamp pad 1 applies a constant pressure against the piece 3. In stage one the tamp pad portion 34 being in a position 35 is on its way in the direction towards the piece 3. In stage two it is in a position 36, wherein the bottom 13 is in the commencing phase of the tamp printing, and in stage three in a position 37 also the inside 14 is tamp printed. These three stages are similar to the stages described above with reference to FIGS. 1–3, the tamp pad portions 34 being provided with concave and convex sides. The tamp pad portions 34 have tamp printed the piece 3 in a position 38, when the piece 3 is in position 39. In position 42 the piece 3 is not yet tamp printed but is next to be printed. The tamp pads 34 can of course be designed and be ventilated in different ways for adapting to the piece to be tamp printed, as appears from FIGS. 4 and 5. It appears that the piece 3 described above is a mobile telephone cover, the tamp pad portions 34 on the rotating tamp pad 1 printing metal layers on covers passing by according to the assembly line principle, as appears from FIG. 6.

The tamp printing method described above can of course be used for printing parts of pieces 3 both externally and/or internally with a number of non-rotating tamp pads and/or tamp pad portions rotating in the same tamp printing machine, each tamp pad constituting a sub-station in the tamp printing method. This can be performed while the piece is stationary and/or moving.

The description above is only of preferred embodiments of the invention, and the scope of the invention is only defined by the appended claims.

What is claimed is:

1. A tamp pad for printing at least one picture on a piece, wherein the tamp pad comprises at least one convex side and at least one concave side, at least one of the at least one convex side and at least one of the at least one concave side being adapted to print an image.

2. A tamp pad according to claim 1, wherein at least one aeration channel runs along a side of the block.

3. A tamp pad according to claim 1, wherein said picture is fonned of a metal ink.

4. A tamp pad according to claim 1, wherein the tamp pad further comprises a block, the block having at least one convex side and at least one concave side, at least one of the at least one convex side and at least one of the at least one concave side being adapted to print an image.

5. A tamp pad according to claim 4, wherein the tamp pad comprises at least one aeration hole.

6. A tamp pad according to claim 4, wherein said picture is formed of a metal ink.

7. A tamp pad according to claim 1, wherein the tamp pad comprises notches that divide the tamp pad into a plurality of tamp pad portions that individually can print a picture on an inside of a piece.

8. A tamp pad according to claim 7, wherein the tamp pad is rotatably arranged on a shaft, the tamp pad portions of the tamp pad cooperating with the shaft and fetching said picture from a rotating printing block.

9. A tamp pad according to claim 8, wherein said tamp pad portions cooperate with pieces being transported on a conveyer belt and print said picture on said transported pieces.

10. A tamp pad according to claim 9, wherein said picture is formed of a metal ink.

11. A tamp pad for printing at least one picture on a piece, wherein the tamp pad comprises a block and at least one aeration channel, the block having at least one convex side and at least one concave side.

12. A tamp pad according to claim 11, wherein said picture is formed of a metal ink.

13. A tamp pad according to claim 11, wherein at least one aeration channel runs along a side of the block.

14. A tamp pad according to claim 13, wherein said picture is formed of a metal ink.

15. A tamp pad according to claim 11, wherein the tamp pad comprises notches that divide the tamp pad into a plurality of tamp pad portions that individually can print a picture on an inside of a piece.

16. A tamp pad according to claim 15, wherein said picture is formed of a metal ink.

17. A tamp pad according to claim 15, wherein the tamp pad is rotatably arranged on a shaft, the tamp pad portions of the tamp pad cooperating with the shaft and fetching said picture from a rotating printing block.

18. A tamp pad according to claim 17, wherein said tamp pad portions cooperate with pieces being transported on a conveyer belt and print said picture on said transported pieces.

19. A tamp pad according to claim 18, wherein said picture is formed of a metal ink.

20. A tamp pad according to claim 19, wherein said piece is a mobile telephone cover.

* * * * *